(12) United States Patent
Prechtl et al.

(10) Patent No.: US 12,471,305 B2
(45) Date of Patent: Nov. 11, 2025

(54) WATER AND ION BARRIER FOR III-V SEMICONDUCTOR DEVICES

(71) Applicant: Infineon Technologies Austria AG, Villach (AT)

(72) Inventors: Gerhard Prechtl, Rosegg (AT); Oliver Haeberlen, St. Magdalen (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/100,620

(22) Filed: Jan. 24, 2023

(65) Prior Publication Data

US 2023/0163209 A1    May 25, 2023

Related U.S. Application Data (62) Division of application No. 14/869,457, filed on Sep. 29, 2015, now abandoned.

(51) Int. Cl.
*H10D 30/47* (2025.01)
*H01L 23/00* (2006.01)
(Continued)

(52) U.S. Cl.
CPC ....... *H10D 30/4755* (2025.01); *H01L 23/564* (2013.01); *H10D 30/015* (2025.01);
(Continued)

(58) Field of Classification Search
CPC .................. H01L 23/5226; H10D 62/8503
See application file for complete search history.

(56) References Cited

U.S. PATENT DOCUMENTS 5,369,299 A * 11/1994 Byrne ................... H01L 23/573
257/769
5,413,962 A *  5/1995 Lur ..................... H01L 23/5226
257/E23.161
(Continued)

FOREIGN PATENT DOCUMENTS

CN          101278391 A     10/2008

OTHER PUBLICATIONS

"Study of Field Plate Effects on AlGaN/GaN HEMTs" by Kaddeche et al. (Year: 2009).*

*Primary Examiner* — Evren Seven
(74) *Attorney, Agent, or Firm* — Murphy, Bilak & Homiller, PLLC (57) ABSTRACT

A semiconductor device includes: a device formed in a III-V semiconductor body; metal layer(s) above the III-V semiconductor body; an interlayer dielectric adjacent each metal layer; vias electrically connecting each metal layer to the device formed in the III-V semiconductor body; a passivation layer touching and being supported by a top surface of the III-V semiconductor body, the lowermost interlayer dielectric touching and being supported by a top surface of the passivation layer, the passivation layer being an ineffective barrier against diffusion of water, water ions, sodium ions and potassium ions into the III-V semiconductor body; and a barrier interposed between a first oxide layer and a second oxide layer of the lowermost interlayer dielectric. The barrier is configured to prevent water, water ions, sodium ions and potassium ions from diffusing into the first oxide layer of the lowermost interlayer dielectric and which is immediately below the barrier.

22 Claims, 11 Drawing Sheets

(51) Int. Cl.
  *H01L 23/31* (2006.01)
  *H10D 30/01* (2025.01)
  *H10D 62/824* (2025.01)
  *H10D 62/85* (2025.01)
  *H10D 64/00* (2025.01)

(52) U.S. Cl.
  CPC ......... *H10D 30/475* (2025.01); *H10D 62/824* (2025.01); *H01L 23/3192* (2013.01); *H10D 62/8503* (2025.01); *H10D 64/111* (2025.01)

(56) References Cited

U.S. PATENT DOCUMENTS

| | | | |
|---|---|---|---|
| 5,712,206 A * | 1/1998 | Chen | H01L 23/5258 257/E23.15 |
| 5,841,190 A | 11/1998 | Noda et al. | |
| 5,851,603 A | 12/1998 | Tsai et al. | |
| 6,189,209 B1 * | 2/2001 | Saran | H01L 23/5226 257/773 |
| 7,595,209 B1 | 9/2009 | Monadgemi et al. | |
| 8,941,218 B1 | 1/2015 | Perkins et al. | |
| 8,969,921 B2 | 3/2015 | Okamoto et al. | |
| 9,305,995 B1 | 4/2016 | Sun | |
| 2001/0013638 A1 * | 8/2001 | Lam | H01L 21/76832 257/E21.252 |
| 2002/0028576 A1 * | 3/2002 | Hashim | H01L 21/76805 438/653 |
| 2002/0036348 A1 | 3/2002 | Matsunaga et al. | |
| 2002/0153529 A1 | 10/2002 | Shie | |
| 2003/0165781 A1 | 9/2003 | Takeda | |
| 2004/0094839 A1 | 5/2004 | Fitzsimmons et al. | |
| 2006/0219997 A1 | 10/2006 | Kawasaki et al. | |
| 2007/0045688 A1 | 3/2007 | Sashida | |
| 2008/0001291 A1 | 1/2008 | Nagai | |
| 2008/0073685 A1 | 3/2008 | Wang | |
| 2008/0087897 A1 | 4/2008 | Iwakami | |
| 2008/0121896 A1 | 5/2008 | Takizawa et al. | |
| 2008/0185623 A1 | 8/2008 | Sashida | |
| 2008/0211066 A1 | 9/2008 | Akedo et al. | |
| 2008/0224195 A1 | 9/2008 | Wang et al. | |
| 2008/0258195 A1 | 10/2008 | Sugawara et al. | |
| 2009/0106726 A1 | 4/2009 | Feilchenfeld et al. | |
| 2009/0160020 A1 | 6/2009 | Barth et al. | |
| 2009/0206379 A1 | 8/2009 | Kitazaki et al. | |
| 2011/0169135 A1 | 7/2011 | Nakao | |
| 2012/0115300 A1 | 5/2012 | Hirota et al. | |
| 2012/0218796 A1 | 8/2012 | Okamoto | |
| 2012/0305992 A1 | 12/2012 | Marino et al. | |
| 2012/0307534 A1 * | 12/2012 | Yamada | H10D 62/8503 257/E29.081 |
| 2013/0153923 A1 | 6/2013 | Decoutere | |
| 2013/0228929 A1 | 9/2013 | Meinhold et al. | |
| 2013/0256685 A1 | 10/2013 | Ohki | |
| 2013/0277680 A1 | 10/2013 | Green et al. | |
| 2013/0288438 A1 | 10/2013 | Jensen et al. | |
| 2014/0061659 A1 | 3/2014 | Teplik et al. | |
| 2014/0264360 A1 * | 9/2014 | Huang | H01L 29/2003 257/268 |
| 2015/0004718 A1 | 1/2015 | Sun et al. | |
| 2015/0072441 A1 | 3/2015 | Sun | |
| 2015/0137187 A1 | 5/2015 | Aoki et al. | |
| 2015/0155359 A1 | 6/2015 | Tsai et al. | |
| 2015/0206893 A1 | 7/2015 | Sun et al. | |
| 2015/0221658 A1 | 8/2015 | Wang | |
| 2015/0295051 A1 | 10/2015 | Donkers et al. | |
| 2015/0311084 A1 | 10/2015 | Moore et al. | |
| 2015/0325523 A1 | 11/2015 | Leobandung | |
| 2016/0049375 A1 | 2/2016 | Kume et al. | |
| 2016/0079066 A1 * | 3/2016 | Takada | H01L 21/283 438/586 |
| 2016/0141423 A1 | 5/2016 | Diaz et al. | |
| 2016/0172194 A1 | 6/2016 | Kunnen et al. | |
| 2016/0190321 A1 | 6/2016 | Wang et al. | |
| 2017/0092753 A1 * | 3/2017 | Prechtl | H01L 23/564 |
| 2017/0243936 A1 | 8/2017 | Ostermaier et al. | |
| 2017/0256638 A1 | 9/2017 | Macelwee et al. | |
| 2018/0012770 A1 | 1/2018 | Macelwee et al. | |

* cited by examiner

WATER AND ION BARRIER FOR III-V SEMICONDUCTOR DEVICES

TECHNICAL FIELD

The present application relates to III-V semiconductor devices, in particular a water and ion barrier for III-V semiconductor devices.

BACKGROUND

GaN based semiconductors provide superior performance figure of merits compared to silicon based semiconductors due to outstanding material properties. Additionally GaN based semiconductors are also very robust against oxidation and other chemicals. However, this robust aspect is not valid if high electric fields are applied on a GaN device within a humid environment. The combination of a high electric field and moisture leads to severe oxidation of the GaN or AlGaN surface layer, and therefore to destruction of the device. The reduction-oxidation (redox) reaction between an $Al_xGa_{1-x}N$ surface layer and water is given by:

$$2Al_xGa_{1-x}N + 3H_2O = xAl_2O_3 + (1-x)Ga_2O_3 + N_2\uparrow 3H_2\uparrow. \quad (1)$$

In the electrochemical cell, the gate metal acts as the cathode which provides electrons to the water at the interface. The corresponding reduction reaction for the water is given by:

$$2H_2O + 2e^- = H_2 + 2OH^-. \quad (2)$$

The electrons contribute to the total gate current. On the other hand, the $Al_xGa_{1-x}N$ surface layer acts as the anode and is decomposed and subsequently anodically oxidized in the presence of holes and hydroxyl ions (OH—) as given by the following reactions:

$$2Al_xGa_{1-x}N + 6h^+ = 2xAl^{3+} + 2(1-x)Ga^{3+} + N_2\uparrow \quad (3)$$

and $$2xAl^{3+} + 2(1-x)Ga^{3+} + 6OH^- = xAl_2O_3 + (1-x)Ga_2O_3 + 3H_2O. \quad (4)$$

In summary, for the corrosion process to happen, it is necessary that: (1) holes are available at the top III-Nitride surface layer during high off-state drain bias conditions; and (2) water ions from the ambient diffuse/permeate through the uppermost passivation layer and reach the III-Nitride surface layer. Under high applied fields, holes can be generated by either impact ionization or by inter-band tunneling (trap assisted).

Conventional GaN HEMT (high electron mobility transistor) device structure has a passivation layer on top of the uppermost power metal layer. The passivation layer typically includes a thick oxide layer (in the range of 1000 nm) covering the uppermost power metal layer followed by a dense nitride layer (thickness in the range of 800 nm) on the thick oxide layer. To be compatible with Si processes, the interlayer dielectrics which separate the metal layers of the device consist of oxides and the surface passivation of the GaN device is usually a thin silicon nitride layer having a thickness of several 100 nm. The silicon nitride surface passivation layer typically has low nitride density and therefore is an ineffective barrier against ions. Even in the case of a nitride-dense surface passivation layer, a standard 100 nm thick silicon nitride layer may be too thin to block ions over the required device lifetime. Without damage to the top passivation layer, this conventional GaN HEMT device structure concept can withstand temperature, humidity and bias (THB) testing, which often is a required test for releasing a product into the market.

Due to the lateral device structure and the capability of GaN, GaN HEMTs are often used as power devices in which a large amount of current flows through the power metallization of the device. Because of this large current, the power metallization thickness is in the range of several μm to satisfy electromigration requirements. Metals such as Al, AlCu, AlSiCu and Au are often used as the power metallization for GaN HEMTs to be compatible with the Si CMOS technology. Copper power metallization is not an option due to dendrite formation in the lateral device concept. The drawback of Al, AlCu, AlSiCu and Au is the softness of the material. The metal lines tend to move or deform (so-called ratcheting effect) after temperature cycling due to package-induced thermomechanical stresses which arise because of thermal mismatch of the temperature coefficients of the different material systems.

As a result, movement/deformation of the power metal lines induces cracks in the top passivation layer. These cracks easily will extend downward into the interlayer dielectrics which separate the different metal layers. If a relatively thick top passivation layer is used e.g. >800 nm, the passivation crack length is at least on the order of the passivation layer thickness. The energy of the passivation crack is a function of the passivation thickness. As such, for standard thick top passivation layers, the passivation crack easily propagates into the interlayer dielectrics and even down to the GaN surface layer. This effect is responsible for the insufficient THB lifetimes often observed in conventional GaN devices.

As described above in detail, water ions and high electric fields are needed for the destruction of GaN devices. High electric fields cannot be avoided in power devices, as such novel barrier concepts are needed which hinder water and corresponding water ions (e.g. OH$^-$ and H$_3$O$^+$) and other ions such as sodium and potassium ions from reaching the GaN or the AlGaN surface layer. Even if ions only diffuse into the interlayer dielectrics without reaching the semiconductor surface, the ions still effect the electric field distribution in each interlayer dielectric penetrated by the ions. This is a concern for all III-V devices, including GaN devices, particularly if ions reach the lowermost interlayer dielectric where spacing is the most critical and therefore can lead to device destruction. For example in the case of water and high fields, device destruction occurs due to corrosion. In the case of Na ions, destruction occurs due to electric field redistributions which give rise to high local electric fields which can lead to local dielectric breakdown/device breakdown. As such, an effective water and ion barrier solution is desirable.

SUMMARY

A semiconductor device comprises an III-V semiconductor body, a device formed in the III-V semiconductor body, one or more metal layers above the III-V semiconductor body, an interlayer dielectric adjacent each metal layer, a plurality of vias electrically connecting each metal layer to the device formed in the III-V semiconductor body, and a barrier disposed below the uppermost metal layer and in or above the lowermost interlayer dielectric. The barrier is configured to prevent water, water ions, sodium ions and potassium ions from diffusing into the interlayer dielectric or portion of the interlayer dielectric immediately below the barrier.

According to an embodiment of a method of manufacturing a semiconductor device, the method comprises: forming a device in an III-V semiconductor body; forming one or more metal layers above the III-V semiconductor body; forming an interlayer dielectric adjacent each metal layer; forming a plurality of vias electrically connecting each metal layer to the device formed in the III-V semiconductor body; and forming a barrier below the uppermost metal layer and in or above the lowermost interlayer dielectric, the barrier configured to prevent water, water ions, sodium ions and potassium ions from diffusing into the interlayer dielectric or portion of the interlayer dielectric immediately below the barrier.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

An III-V semiconductor device is provided which has metal layers separated from one another by interlayer dielectrics, and a barrier disposed below the uppermost metal layer and in or above the lowermost interlayer dielectric. The term 'interlayer dielectric' as used herein refers to a dielectric material used to electrically separate closely spaced interconnect lines arranged in different wiring levels (multilevel metallization). The barrier is configured i.e. arranged or prepared to prevent water, water ions (e.g. $OH^-$ and $H_3O^+$), sodium ions and potassium ions from diffusing into the interlayer dielectric or portion of the interlayer dielectric immediately below the barrier over the required or specified device lifetime. The barrier can be interposed between two layers of the same interlayer dielectric, or disposed on one of the interlayer dielectrics i.e. touching and being supported by the top surface of that interlayer dielectric.

In some cases, a passivation layer can be provided on the uppermost metal layer which is often the power metal layer and therefore the thickest metal layer. In the case of a relatively thick top passivation layer e.g. >800 nm thick, an electrically conductive liner can be interposed between each metal line of the uppermost metal layer and the interlayer dielectric immediately below the uppermost metal layer and can extend outward beyond opposing side faces of the metal line above that electrically conductive liner. The extended region of each electrically conductive liner prevents cracks in the relatively thick top passivation layer from propagating downward into the underlying interlayer dielectrics and barrier. In the case of a relatively thin top passivation layer e.g. <800 nm thick, the optional electrically conductive liner extension can be omitted. More than one barrier can be provided. In the case of two or more barriers, the ions barriers can comprise the same or different materials. The embodiments described herein can be implemented interchangeably unless technically or explicitly prohibited against.

Figure 1:
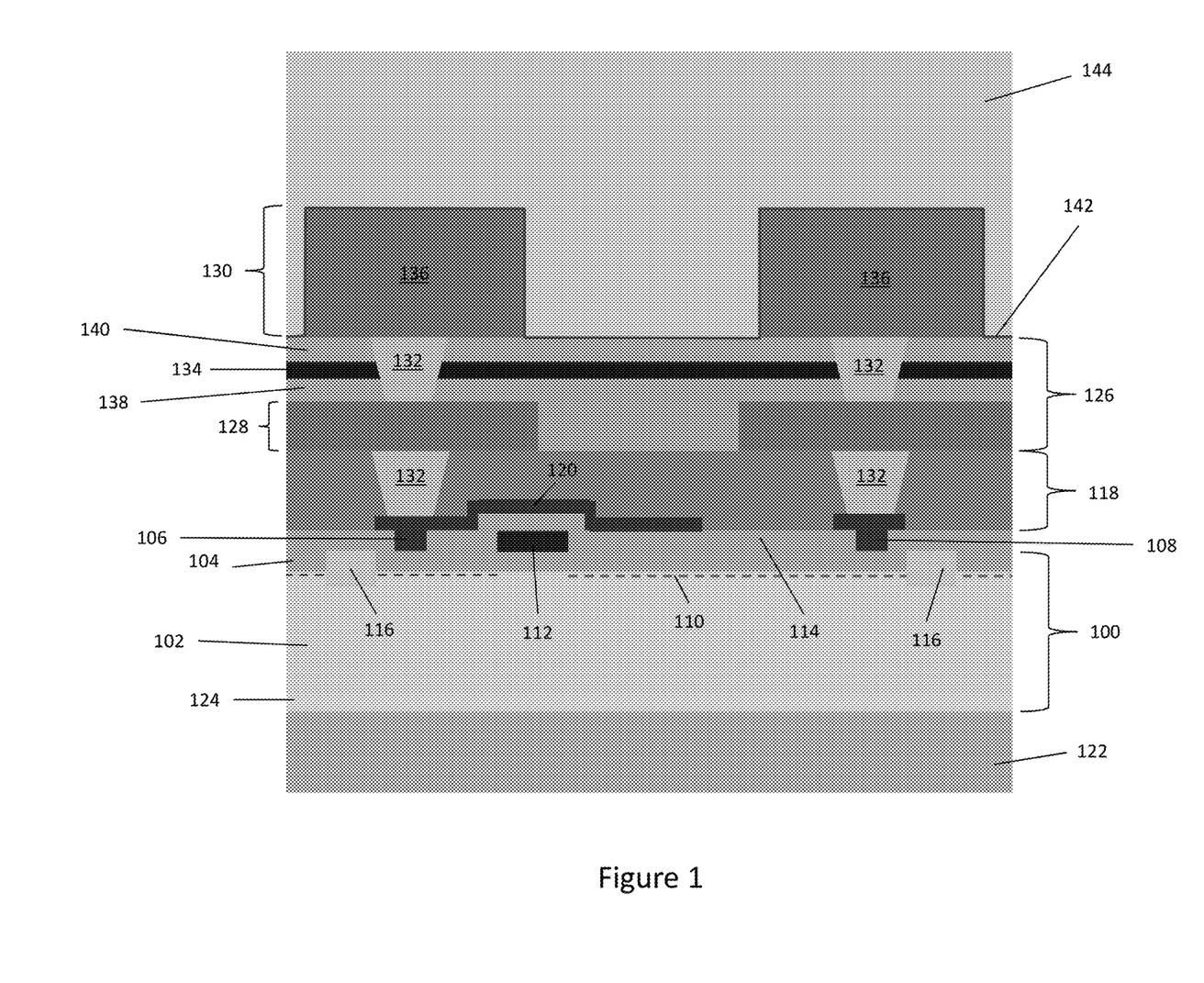
FIGS. 1 through 11 illustrate respective partial sectional views of an III-V semiconductor device having a water and ion barrier, according to different embodiments.

FIG. 1 illustrates a partial sectional view of one embodiment of an III-V semiconductor device. The semiconductor device comprises an III-V semiconductor body 100 and a device formed in the III-V semiconductor body 100. In the case of an III-nitride device, the semiconductor body 100 can include an III-nitride buffer 102 and an III-nitride barrier 104 which form a heterostructure. In the case of a transistor device formed in the III-V semiconductor body 100, the semiconductor body 100 also includes a source 106 and a drain 108 which are spaced apart from one another. The III-nitride barrier 104 has a different band gap than the III-nitride buffer 102 so that a two-dimensional charge carrier gas channel 110 arises along an interface between the III-nitride buffer 102 and the III-nitride barrier 104.

The two-dimensional charge carrier gas channel 110 electrically connects the source 106 and the drain 108. The terms 'source' and 'drain' as used herein refer to respective doped regions of the device or to respective electrodes (as shown) if no doped regions are provided. For example, typical HEMTs have source and drain ohmic contacts which are based on a metal alloy that does not require any additional doping. There is also the option to dope the source and drain region e.g. with Si for III-nitride devices to have an n+ region below the ohmic contact and to lower, therefore, the overall contact resistance of high or low voltage transistors.

Continuing with the transistor device example, a standard gate 112 is provided for controlling the two-dimensional charge carrier gas channel 110. The gate 112 can be a planar (as shown) or trench gate in direct contact with the heterostructure body 100, or electrically insulated from the heterostructure body 100 by a silicon nitride surface passivation layer 114 which is usually a different thickness and even a different material system than the gate dielectric. Additional insulative device isolation regions 116 can be provided.

The silicon nitride surface passivation layer 114 touches and is supported by the top surface of the III-V semiconductor body 100, and a lowermost interlayer dielectric 118 touches and is supported by the top surface of the surface passivation layer 114. The silicon nitride surface passivation layer 114 can have a Si rich composition and thus have relatively low density of nitride as compared to silicon, and therefore is leaky and an ineffective barrier against the diffusion of water, water ions, sodium ions and potassium ions into the underlying III-V semiconductor body 100. Even if the surface passivation layer 114 is nitride dense, the standard passivation thicknesses of about 100 nm is too thin for the surface passivation layer 114 to be an effective water and ion barrier for the entire lifetime of the device.

The gate 112 controls the conducting or non-conducting state of the two-dimensional charge carrier gas channel 110. The transistor device can be normally-on or normally-off. The channel 110 of a normally-off HEMT is disrupted absent a voltage applied to the gate 112, and disrupted in the presence of a suitable gate voltage for a normally-on device. For example in the case of a normally-off pGaN device, the gate 112 can be placed on top of a p-doped GaN layer (not shown) which is disposed on top of the III-nitride barrier 104. This additional pGaN layer can be patterned so that it is placed only below the gate 112. In general, the embodiments described herein can be applied to both normally-on and normally-off transistor devices and to other types of active devices such as power diodes.

The III-V semiconductor device can further include a field plate 120 disposed between the source 106 and the drain 108. The field plate 120 can be made of semiconductor material or metal and can be electrically connected to the source 106 via a contact or to the gate 112, and is configured to minimize the electric field at the gate edge. The field plate configuration shown in FIG. 1 is merely an example. Any desired field plate configuration can be used. For example, the field plate 120 can have different shapes, more than one field plate can be provided which can be connected either to the source 106 or gate 112, etc.

In one embodiment, the III-V semiconductor device is a GaN-based HEMT. Specifically with regard to GaN technology, the presence of polarization charges and strain effects in a GaN-based heterostructure body due to spontaneous and piezoelectric polarization yield a two-dimensional charge carrier gas 110 in the heterostructure body 100 characterized by very high carrier density and carrier mobility. This two-dimensional charge carrier gas 110, such as a 2DEG (two-dimensional electron gas) or 2DHG (two-dimensional hole gas), forms the conductive channel of the device near the interface between the III-nitride barrier 104, e.g., a GaN alloy barrier such as AlGaN, InAlGaN, InAlN, etc. and the III-nitride buffer 102, e.g., a GaN buffer. A thin, e.g. 1-2 nm, AlN layer can be provided between the GaN buffer 102 and the GaN alloy barrier 104 to minimize alloy scattering and enhance 2DEG mobility.

In a broad sense, the III-V semiconductor device described herein can be formed from any binary, ternary or quaternary III-nitride compound semiconductor material where piezoelectric effects or a heterojunction is responsible for the device concept. The buffer 102 can be manufactured on a semiconductor substrate 122 such as a Si, SiC or sapphire substrate, on which a nucleation (seed) layer 124 such as an AlN layer can be formed for providing thermal and lattice matching to the buffer 102. The III-V semiconductor device may also have AlInN/AlN/GaN barrier/spacer/buffer layer structures. In general, the III-V semiconductor device can be realized using any suitable III-V technology such as GaAs, GaN, etc.

The III-V semiconductor device also includes a plurality of interlayer dielectrics 118, 126 above the III-V semiconductor body 100 and a plurality of metal layers 128, 130 separated from one another by the interlayer dielectrics 118, 126. Two metal layers 128, 130 and two interlayer dielectrics 118, 126 are shown in FIG. 1 for ease of illustration. In general, the III-V semiconductor device can have one or more metal layers and a corresponding number of interlayer dielectrics. Vias 132 extend through the interlayer dielectrics 118, 126 and electrically connect the metal layers 128, 130 to the device formed in the III-V semiconductor body 100. For example in FIG. 1, vias 132 extend through the interlayer dielectrics 118, 126 and electrically connect the metal layers 128, 130 to the source 106, drain 108 and gate 112 of the transistor device formed in the III-V semiconductor body 100 (the gate connections are out of view in FIG. 1).

The III-V semiconductor device further includes a barrier 134 disposed below the uppermost metal layer 130 e.g. the power metal layer and in or above the lowermost interlayer dielectric 118. The barrier 130 extends under the metal lines 136 of the uppermost metal layer 130. The barrier 134 is configured to prevent water ions, sodium ions and potassium ions from diffusing into the interlayer dielectric 126 or portion of the interlayer dielectric 126 immediately below the barrier 134 over the required or specified device lifetime. This way, the electric field distribution in each interlayer dielectric 118, 126 or portion of each interlayer dielectric 118, 126 immediately below the barrier 134 is unaffected by ions. In the case of an III-nitride material system e.g. of the kinds previously described herein, the barrier 134 also prevents oxidation of the nitride-based surface layer 104 of the semiconductor body 100 by blocking water and water ions. Silicon oxynitride and silicon nitride are effective barriers against water, water ions, sodium ions and potassium ions, and are compatible with standard silicon processing technologies. Still other types of water/ion barrier materials can be used. The barrier 134 can comprise a single layer of the same material e.g. of silicon oxynitride or silicon nitride or a plurality of layers of different materials e.g. silicon oxynitride encased by silicon nitride.

According to the embodiment shown in FIG. 1, the barrier 134 comprises silicon oxynitride or silicon nitride and the interlayer dielectrics 118, 126 comprise oxide. In the case of silicon oxynitride, silicon oxynitride is typically under tensile stress and oxide is under compressive stress. The barrier 134 can be interposed between a first oxide layer 138 and a second oxide layer 140 of the uppermost interlayer dielectric 126 so that the compressive stress of the oxide layers 138, 140 at least partly counteract tensile silicon oxynitride, protecting the barrier 134 from cracking. The barrier 134 shown in FIG. 1 can be formed by a 3-step deposition process. The 3-step deposition process includes depositing the first oxide layer 138 of the uppermost interlayer dielectric 126 on the metal layer 128 just below the uppermost metal layer 130, depositing silicon oxynitride or silicon nitride on the first oxide layer 138 and depositing the second oxide layer 140 of the uppermost interlayer dielectric 126 on the silicon oxynitride/silicon nitride.

A relatively thin passivation layer 142 made of e.g. oxide and dense nitride can be formed on the uppermost metal layer 130, the passivation layer 142 having a thickness of 800 nm or less. An imide 144 can be formed on the thin passivation layer 142 to complete the III-V semiconductor device. If cracks occur in the top passivation layer 142, the energy of the cracks will be relatively low since the passivation layer 142 is made as thin as possible e.g. 800 nm or less thick. As such, cracks in the top passivation layer 142 should not damage the underlying barrier 134 to the point where the barrier 134 no longer prevents water ions, sodium ions and potassium ions from diffusing into the first oxide layer 138 of the uppermost interlayer dielectric 126 over the required or specified device lifetime. In other cases, the III-V semiconductor device does not include the top passivation layer 142.

Figure 2:
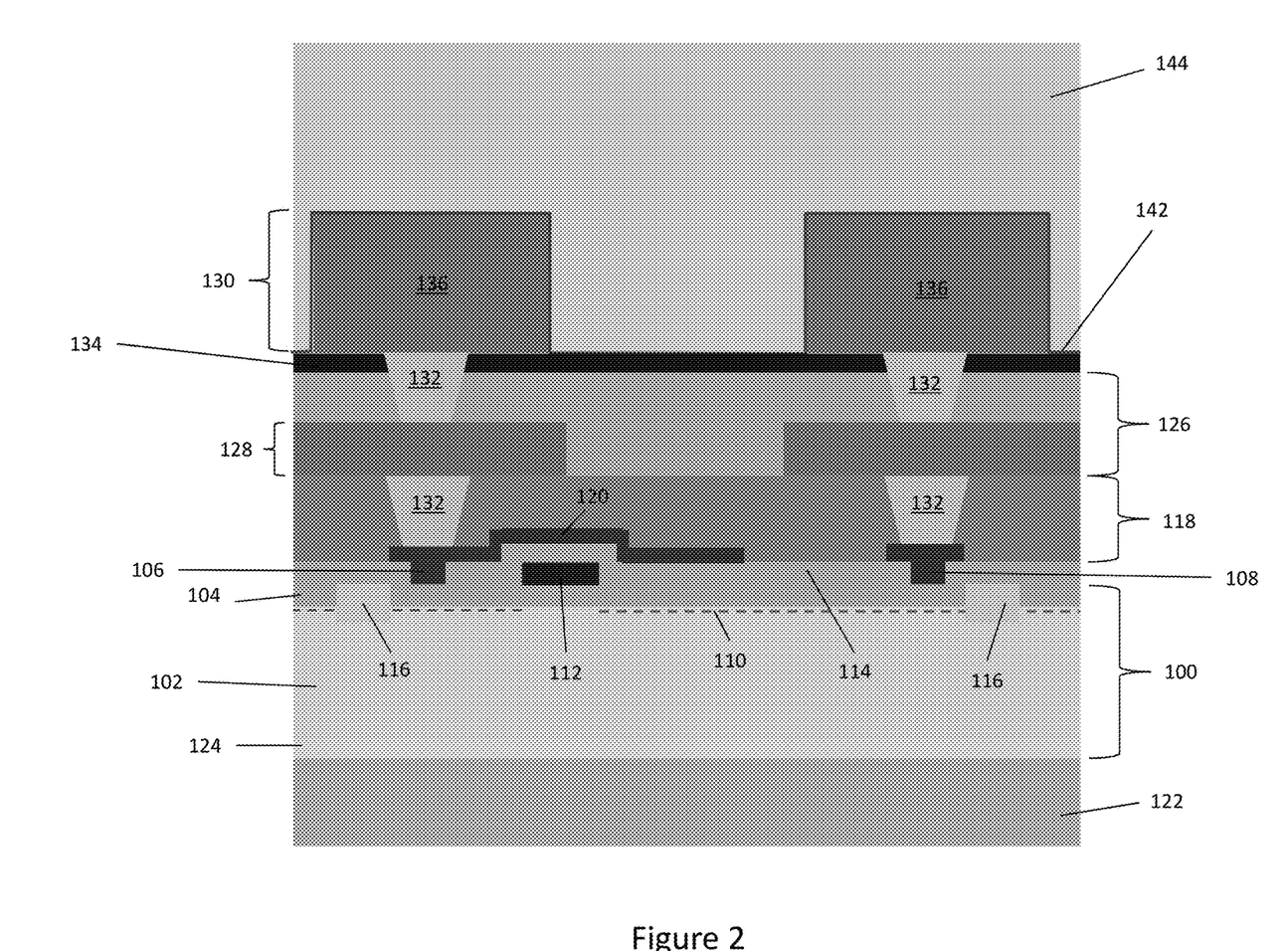

FIG. 2 illustrates a sectional view of another embodiment of an III-V semiconductor device having a water/ion barrier 134 disposed below the uppermost metal layer 130 and in or above the lowermost interlayer dielectric 118. The embodiment shown in FIG. 2 is similar to the embodiment shown in FIG. 1. Different, however, the barrier 134 is touching and being supported by the top surface of the uppermost interlayer dielectric 126 and comprises silicon nitride. Unlike silicon oxynitride which is typically under tensile stress and therefore prone to cracking, silicon nitride is under compressive stress. As such, the barrier 134 need not be interposed between two oxide layers of one of the interlayer dielectrics 118, 126. Instead, the silicon nitride-based barrier 134 is on the uppermost interlayer dielectric 126 according to this embodiment. Also, the density of nitride as compared to silicon is made high enough so that the barrier 134 is not leaky and therefore prevents the diffusion of water ions, sodium ions and potassium ions into the interlayer dielectric 126 immediately below the barrier 134 over the required or specified device lifetime.

In one embodiment, a barrier 134 made of silicon nitride is formed by depositing by chemical vapor deposition a silane-ammonia mixture on one of the interlayer dielectrics 118, 126 or on an oxide layer of one of the interlayer dielectrics 118, 126. The flow rate of silane and ammonia is controlled during the chemical vapor deposition so that the silicon nitride layer formed by the chemical vapor deposition has a concentration of nitride sufficient to prevent water, water ions, sodium ions and potassium ions from diffusing into the interlayer dielectric 118, 126 or portion of the interlayer dielectric 118, 126 immediately below the barrier 134 over the required or specified device lifetime. The barrier 134 made of silicon nitride can have a higher density of nitride than the surface passivation layer 114 on the III-V semiconductor body 100 which may be of poor quality (i.e. leaky) in some cases and therefore ineffective as a water/ion barrier.

Figure 3:
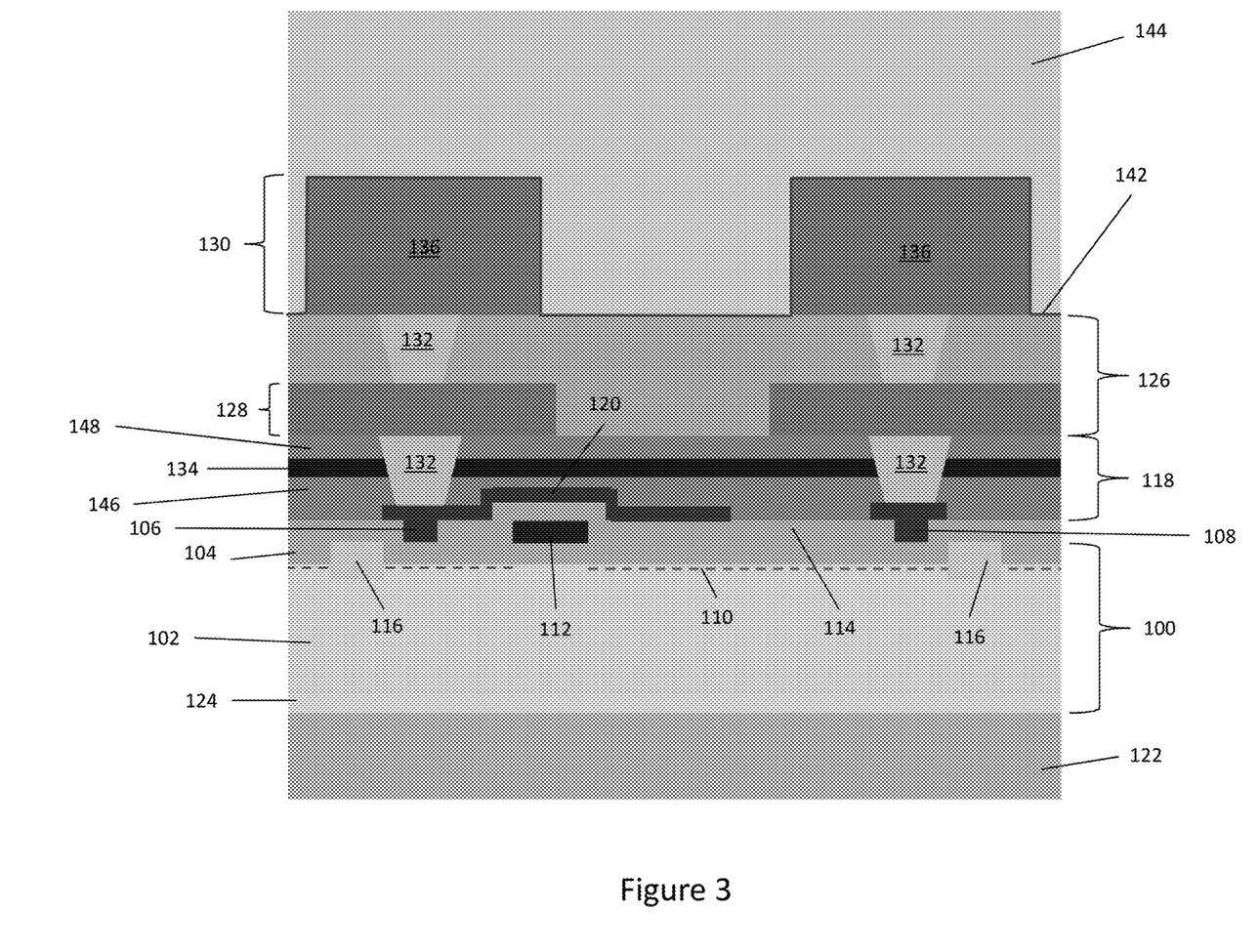

FIG. 3 illustrates a sectional view of yet another embodiment of an III-V semiconductor device having a water/ion barrier 134 disposed below the uppermost metal layer 130 and in or above the lowermost interlayer dielectric 118. The embodiment shown in FIG. 3 is similar to the embodiment shown in FIG. 1. Different, however, the barrier 134 is interposed between a first oxide layer 146 and a second oxide layer 148 of the lowermost interlayer dielectric 118. In the case of a silicon oxynitride or silicon nitride barrier 134, the lowermost interlayer dielectric 118 and the barrier 134 can be formed by the 3-step deposition process previously described herein. The barrier 134 in this embodiment still prevents the electric field distribution in the portion of the lowermost interlayer dielectric 118 below the barrier 134 from being affected by ions. The barrier 134 also still prevents oxidation of a nitride-based surface layer 104 of the semiconductor body 100 by blocking water ions in the case of an III-nitride material system.

Figure 4:
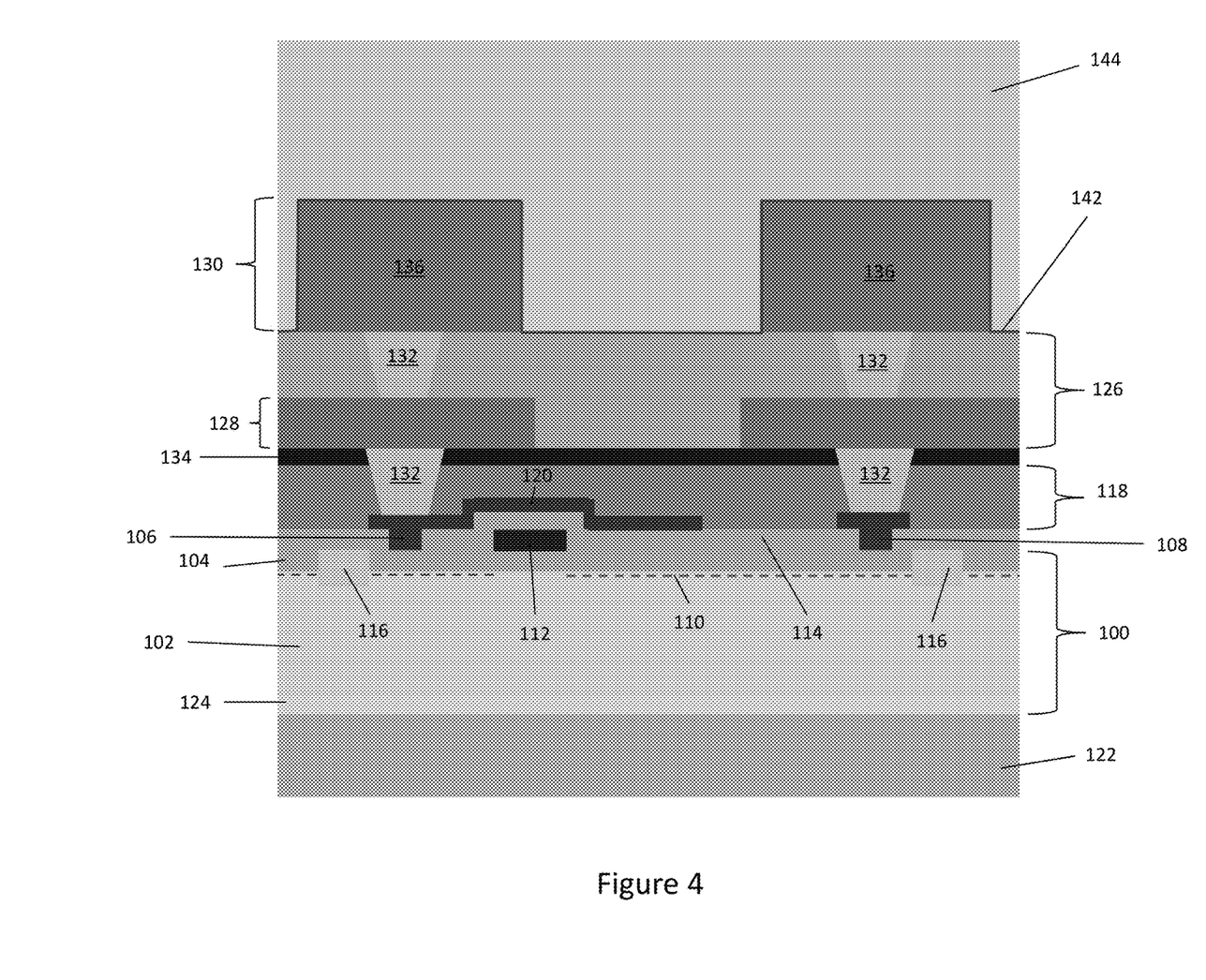

FIG. 4 illustrates a sectional view of still another embodiment of an III-V semiconductor device having a water/ion barrier 134 disposed below the uppermost metal layer 130 and in or above the lowermost interlayer dielectric 118. The embodiment shown in FIG. 4 is similar to the embodiment shown in FIG. 2. Different, however, the barrier 134 is touching and being supported by the top surface of the lowermost interlayer dielectric 118. The barrier 134 can comprise silicon nitride or tensile or compressive silicon oxynitride. In the case of tensile silicon oxynitride, the barrier 134 is interposed between two different interlayer dielectrics 118 and 126 for providing stress relief instead of between two layers of the same interlayer dielectric as shown in FIG. 3.

Figure 5:
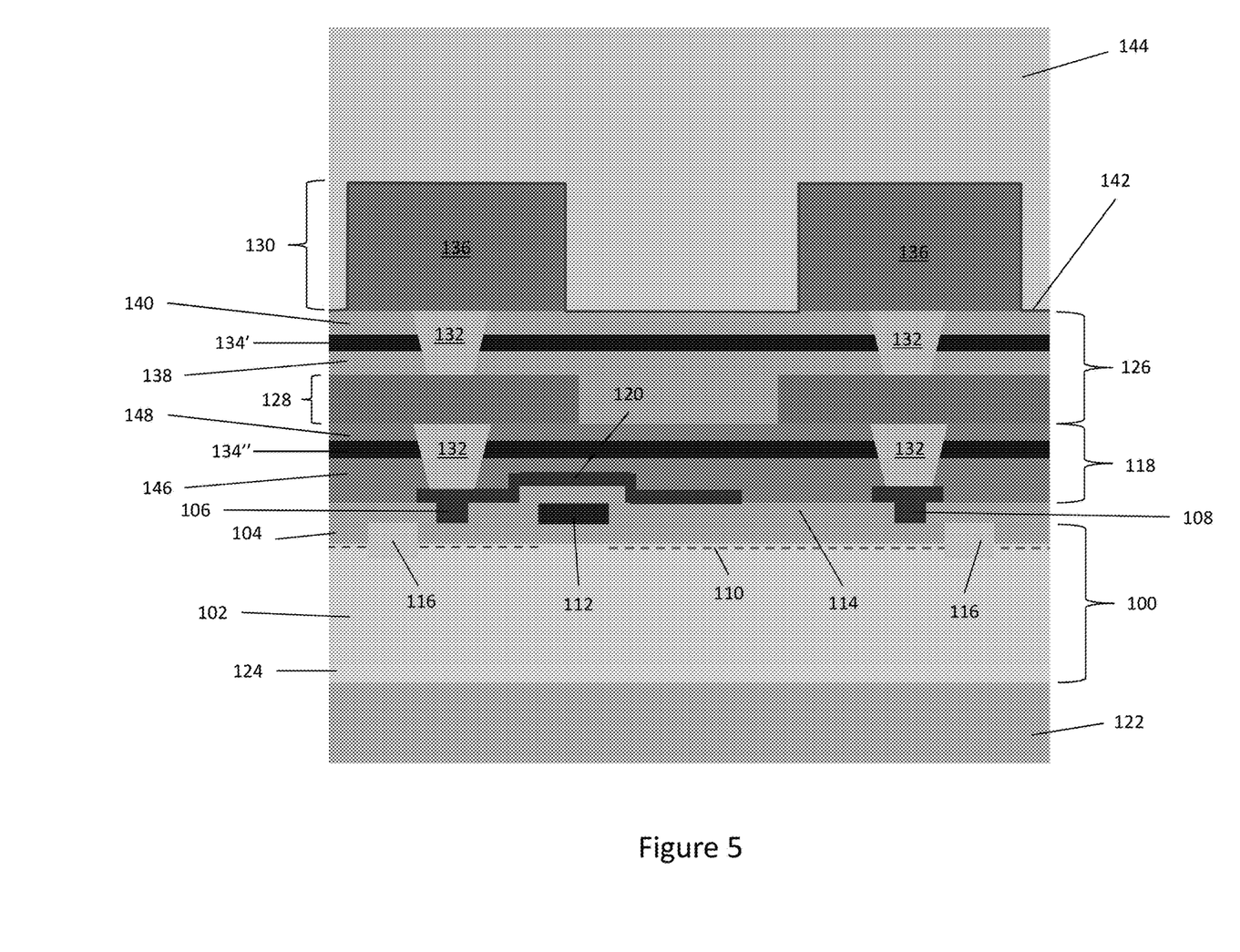

FIG. 5 illustrates a sectional view of an embodiment which combines the barrier features shown in FIGS. 1 and 3. That is, the III-V semiconductor device has a first water/ion barrier 134' made of silicon oxynitride interposed between the first and second oxide layers 138, 140 of the uppermost interlayer dielectric 126 and a second water/ion barrier 134" made of silicon oxynitride interposed between the first and second oxide layers 146, 148 of the lowermost interlayer dielectric 118. Each barrier 134', 134" can comprise a single layer of the same material e.g. of silicon oxynitride or silicon nitride or a plurality of layers of different materials e.g. silicon oxynitride encased by silicon nitride as previously described herein. For example, each interlayer dielectric 118, 126 and the corresponding barrier 134', 134" can be formed by the 3-step deposition process previously described herein.

According to the embodiment shown in FIG. 5, more than one barrier 134', 134" is provided between the uppermost metal layer 130 and the semiconductor passivation layer 114 in case one (or more) of the barriers is damaged. For example if the upper barrier 134' is damaged by crack propagation from the top passivation layer 142 and the cracks do not reach the lower barrier 134", the lower barrier 134" still prevents the electric field distribution in the lower oxide layer 146 of the lowermost interlayer dielectric 118 from being affected by ions and also prevents oxidation of the nitride-based surface layer 104 of the semiconductor body 100 by blocking water ions in the case of an III-nitride material system.

Figure 6:
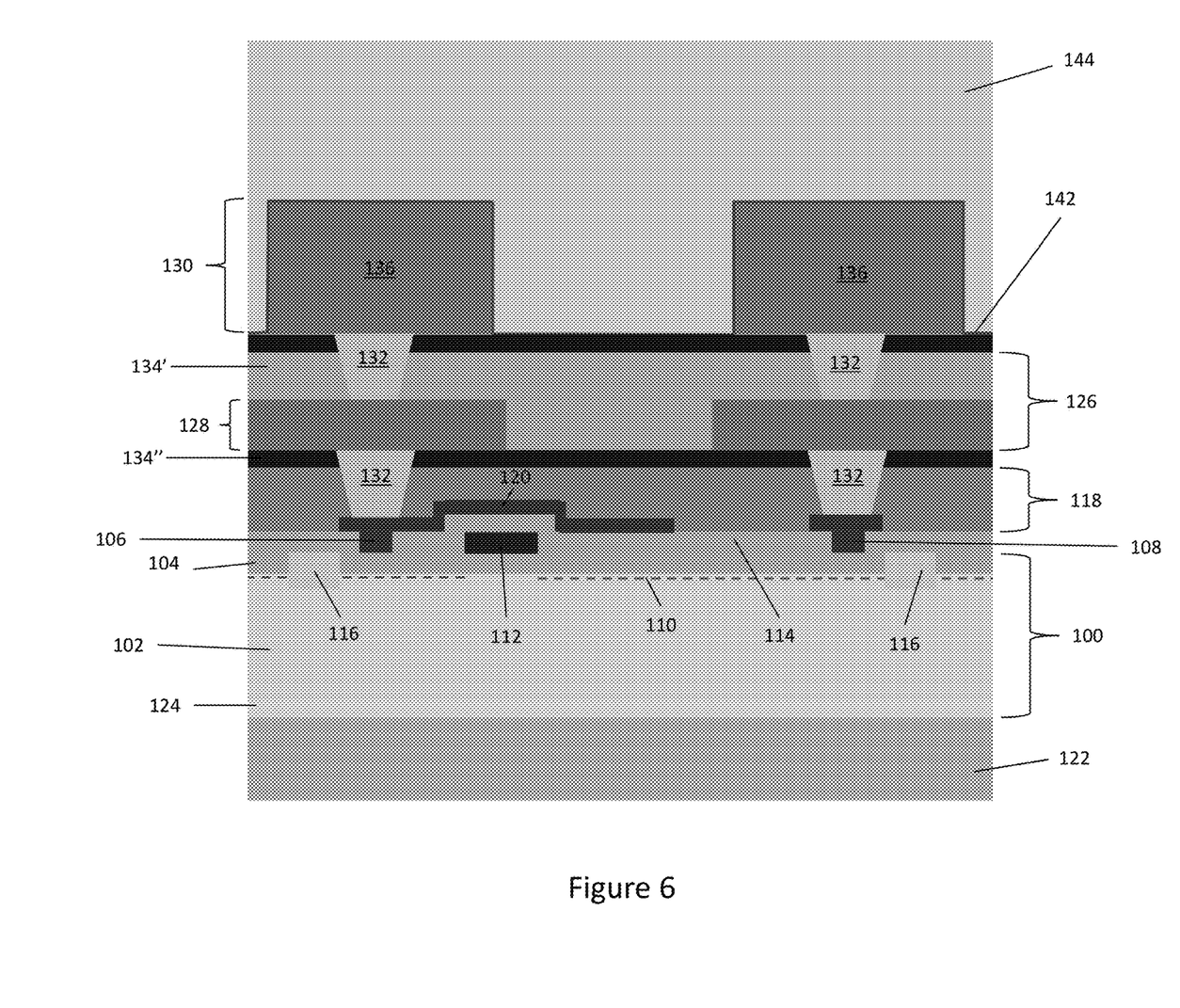

FIG. 6 illustrates a sectional view of an embodiment which combines the barrier features shown in FIGS. 2 and 4. That is, the III-V semiconductor device has a first water/ion barrier 134' made of silicon nitride or compressive silicon oxynitride disposed on the uppermost interlayer dielectric 126 and a second water/ion barrier 134" made of silicon nitride or tensile or compressive silicon oxynitride disposed on the lowermost interlayer dielectric 118. Like the embodiment shown in FIG. 5, more than one barrier 134', 134" is provided between the uppermost metal layer 130 and semiconductor passivation layer 114 in case one (or more) of the barriers is damaged.

Figure 7:
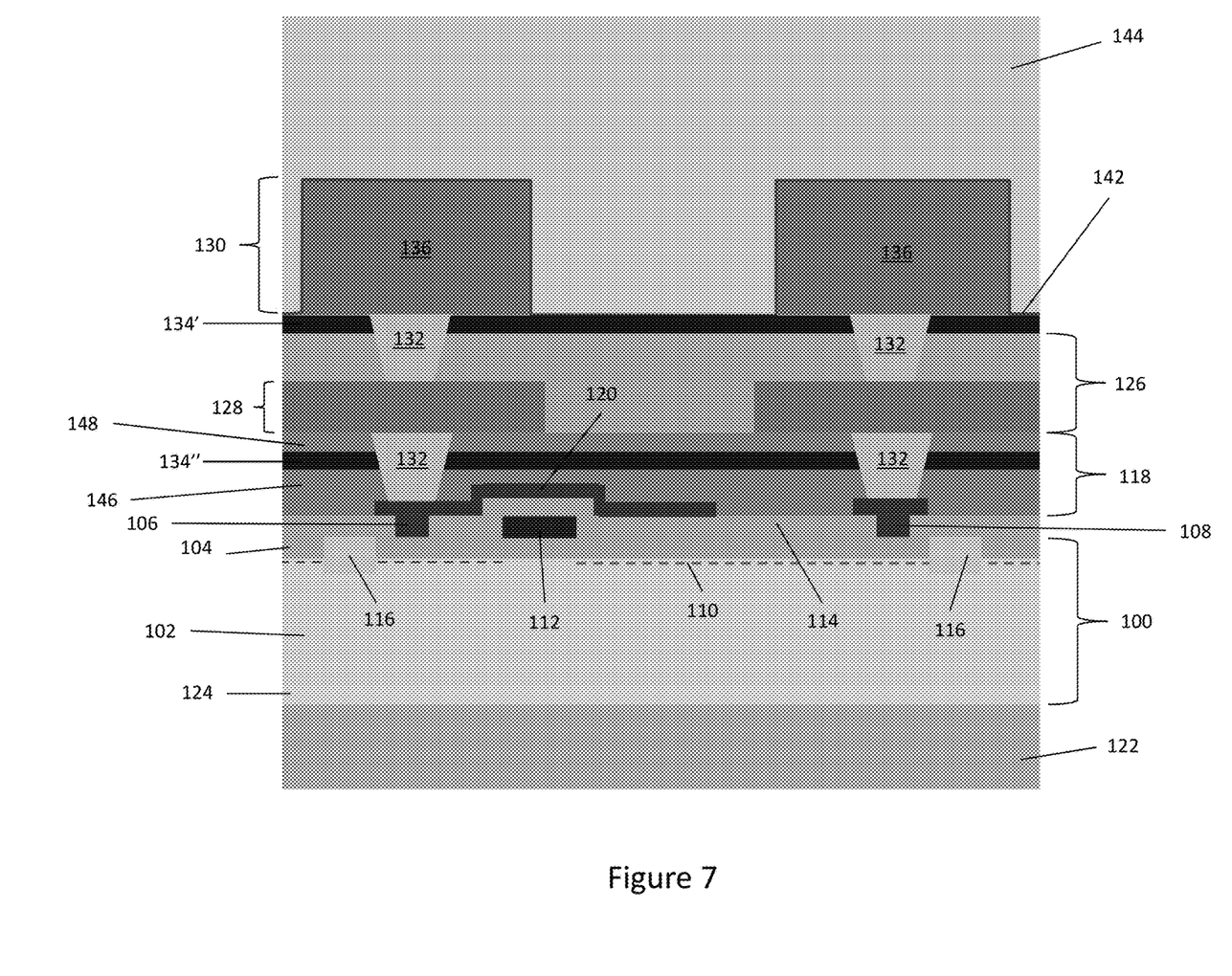

FIG. 7 illustrates a sectional view of another embodiment of an III-V semiconductor device having more than one water/ion barrier 134', 134" disposed below the uppermost metal layer 130 and above the semiconductor passivation layer 114. Different than the embodiments shown in FIGS. 5 and 6, the barriers 134', 134" comprise different materials. For example, the upper barrier 134' can be made of silicon nitride and disposed on the uppermost interlayer dielectric 126 and the lower barrier 134" can be made of tensile silicon oxynitride and interposed between first and second oxide layers 146, 148 of the lowermost interlayer dielectric 118. Alternatively, the upper barrier 134' can comprise silicon oxynitride and be interposed between the first and second oxide layers 138, 140 of the uppermost interlayer dielectric 126 e.g. as shown in FIG. 1 and the lower barrier 134" can comprises silicon nitride or compressive silicon oxynitride and be disposed on the top surface of the lowermost interlayer dielectric 118 e.g. as shown in FIG. 4.

So far, embodiments have been described in which the III-V semiconductor device has two metal layers 128, 130 and two interlayer dielectrics 118, 126. This is for ease of explanation only. The number of metal layers and thus the number of interlayer dielectrics depends on several factors, including the type of device and design of the III-V semiconductor device, the III-V semiconductor technology used to fabricate the device, etc. In general, the III-V semiconductor device can have one or more metal layers and a corresponding number of interlayer dielectrics.

Figure 8:
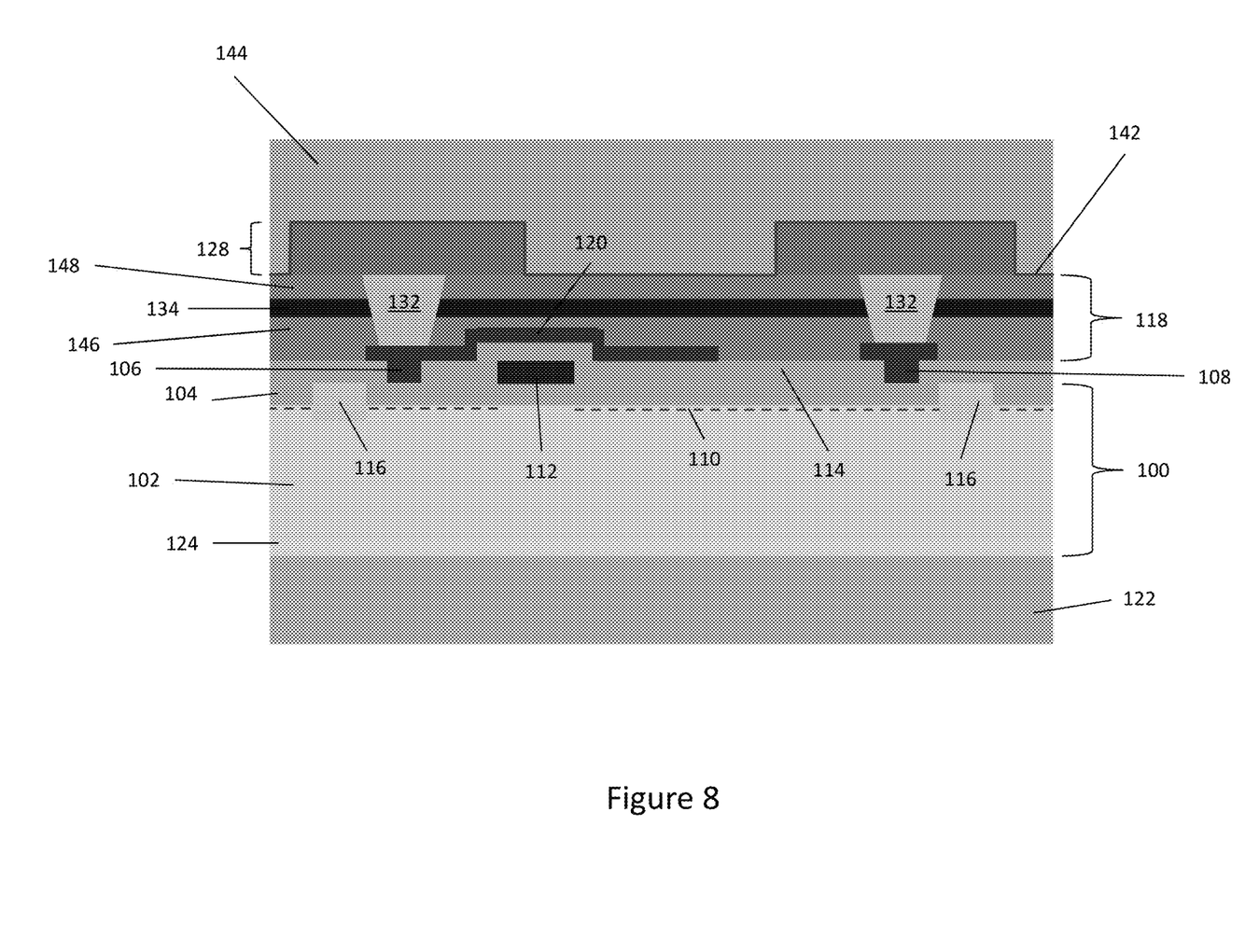

FIG. 8 illustrates a sectional view of an embodiment of an III-V semiconductor device having a single metal layer 128 and a single interlayer dielectric 118. All metal wiring, including power metal lines, are provided in the same metal layer 128. The water/ion barrier 134 comprises silicon nitride or tensile silicon oxynitride and is interposed between a first oxide layer 146 and a second oxide layer 148 of the only interlayer dielectric 118 according to this embodiment. The interlayer dielectric 118 separates the single metal layer 128 from the underlying semiconductor body 100. The single interlayer dielectric 118 and the barrier 134 can be formed by the 3-step deposition process previously described herein.

Figure 9:
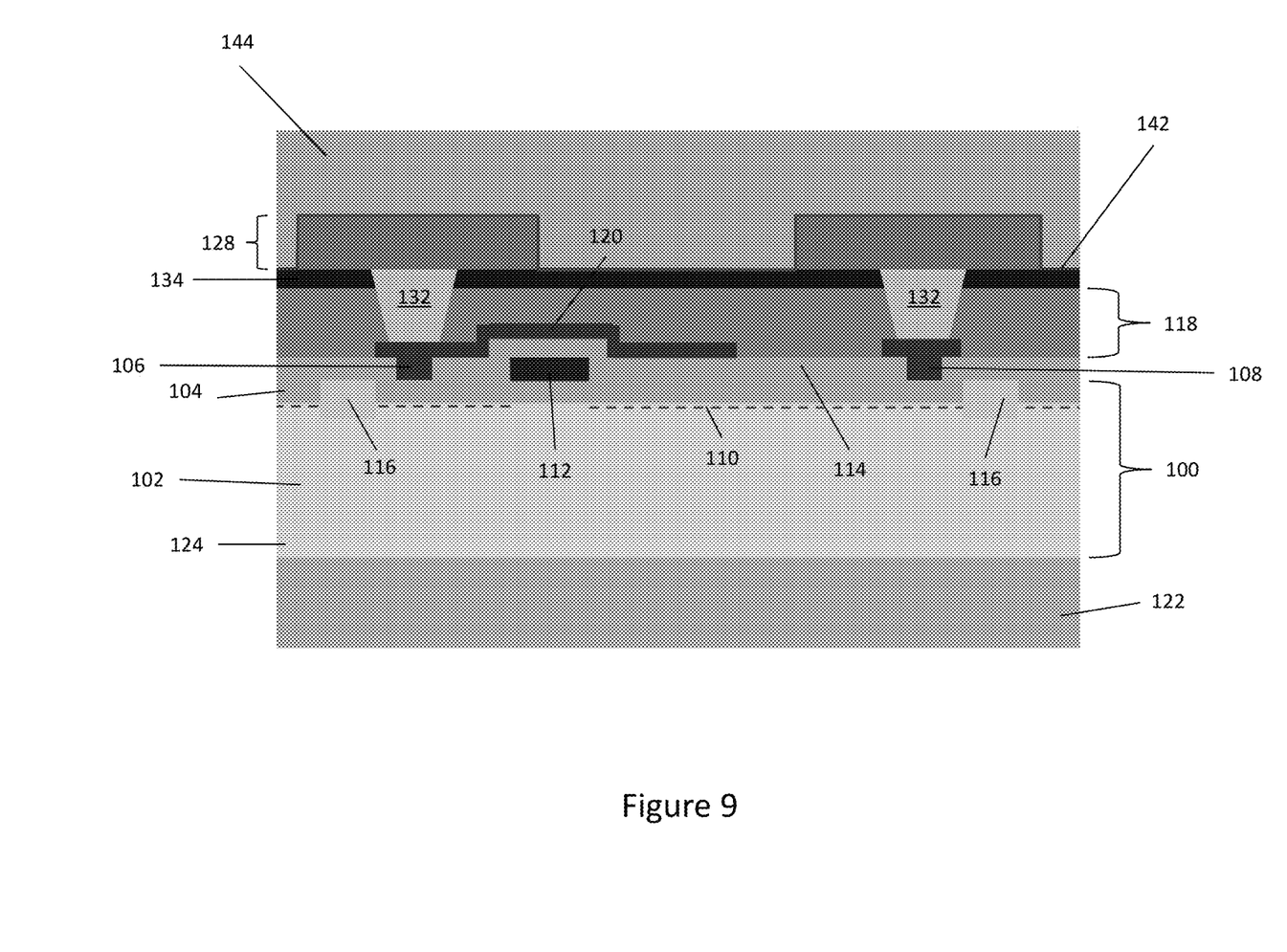

FIG. 9 illustrates a sectional view of another embodiment of an III-V semiconductor device having a single metal layer 128 and single interlayer dielectric 118. The embodiment shown in FIG. 8 is similar to the embodiment shown in FIG. 9. Different, however, the water/ion barrier 134 comprises silicon nitride or compressive silicon oxynitride and is touching and being supported by the top surface of the single interlayer dielectric 118.

The water/ion barrier embodiments previously described herein can be applied to any of the interlayer dielectric(s) included in the III-V semiconductor device—and not to just the uppermost and/or lowermost dielectric layers.

Described next are embodiments in which a relatively thick top passivation layer is used e.g. thicker than about 800 nm. Crack energy is higher with such a thick top passivation layer, and therefore additional safeguards are described for mitigating the increased risk of crack propagation. These additional safeguards can be applied to any of the embodiments previously described herein.

Figure 10:
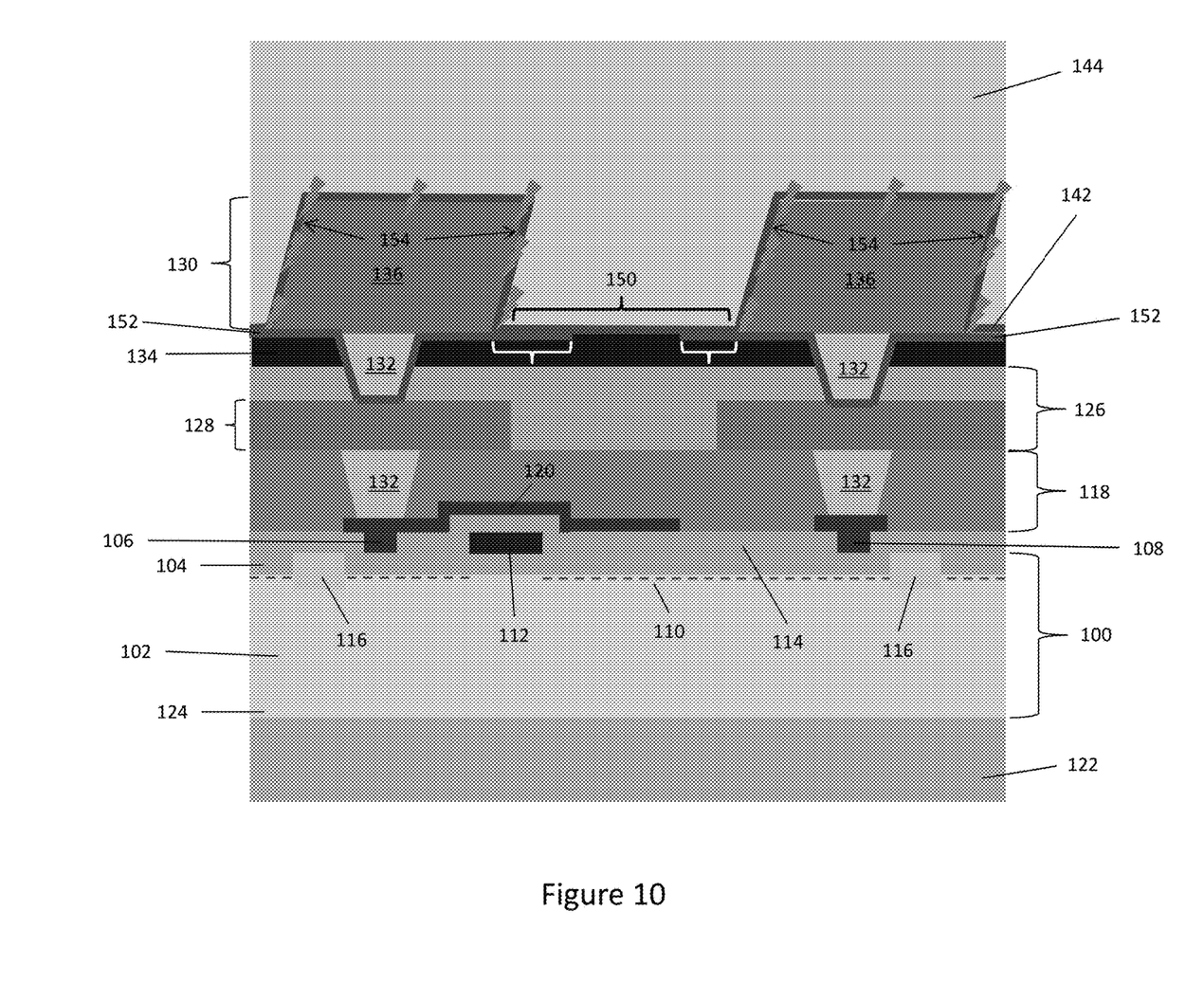

FIG. 10 illustrates a sectional view of an embodiment of an III-V semiconductor device having a top passivation layer 142 with a thickness >800 nm on the uppermost metal layer 130, and a water/ion barrier 134 disposed below the uppermost metal layer 130 and above the semiconductor passivation layer 114. In an exaggerated manner, FIG. 10 shows the deformation/movement in the uppermost metal layer 130 which can occur after temperature cycling due to package-induced thermomechanical stresses which arise because of thermal mismatch of the temperature coefficients of the different material systems used in the III-V semiconductor device. The deformation/movement is particularly pronounced for relatively thick metal lines 136 (e.g. 1000 nm or thicker) made of a relatively soft metal i.e. a metal having a low yield strength such as Al, AlCu, AlSiCu and Au. Cracks in the top passivation layer 142 are graphically illustrated with lightning bolts in FIG. 10. The cracks tend to occur in the region of the top passivation layer 142 contacting the metal lines 136 of the uppermost metal layer 130. The region 150 of the top passivation layer 142 between the metals lines 136 of the uppermost metal layer 130 does not tend to crack.

According to the embodiment shown in FIG. 10, an electrically conductive liner 152 made of e.g. titanium nitride is deposited in openings formed in the barrier 134 and in the uppermost interlayer dielectric 126. Vias 132 are then formed on the liner 152 in the openings. The liner 152 extends laterally onto the barrier 134 or onto the uppermost interlayer dielectric 126 if the barrier 134 is disposed in or below the uppermost interlayer dielectric 126. In each case, each electrically conductive liner 152 extends outward beyond opposing side faces 154 of the corresponding metal line 136 above that electrically conductive liner 152. That is, each electrically conductive liner 152 extends under the region 150 of the top passivation layer 142 positioned between adjacent metals lines 136 of the uppermost metal layer 130 and which has no cracks. The electrically conductive liners 152 are made of a material such as titanium nitride or other suitable material which does not tend to brake or crack easily. As such, by extending each electrically conductive liner 152 under the region 150 of the top passivation layer 142 positioned between adjacent metals lines 136 of the uppermost metal layer 130, the liners 152 function as crack stops by preventing cracks in the relatively thick top passivation layer 142 from propagating to the underlying interlayer dielectrics 126, 118 and barrier(s) 134.

Figure 11:
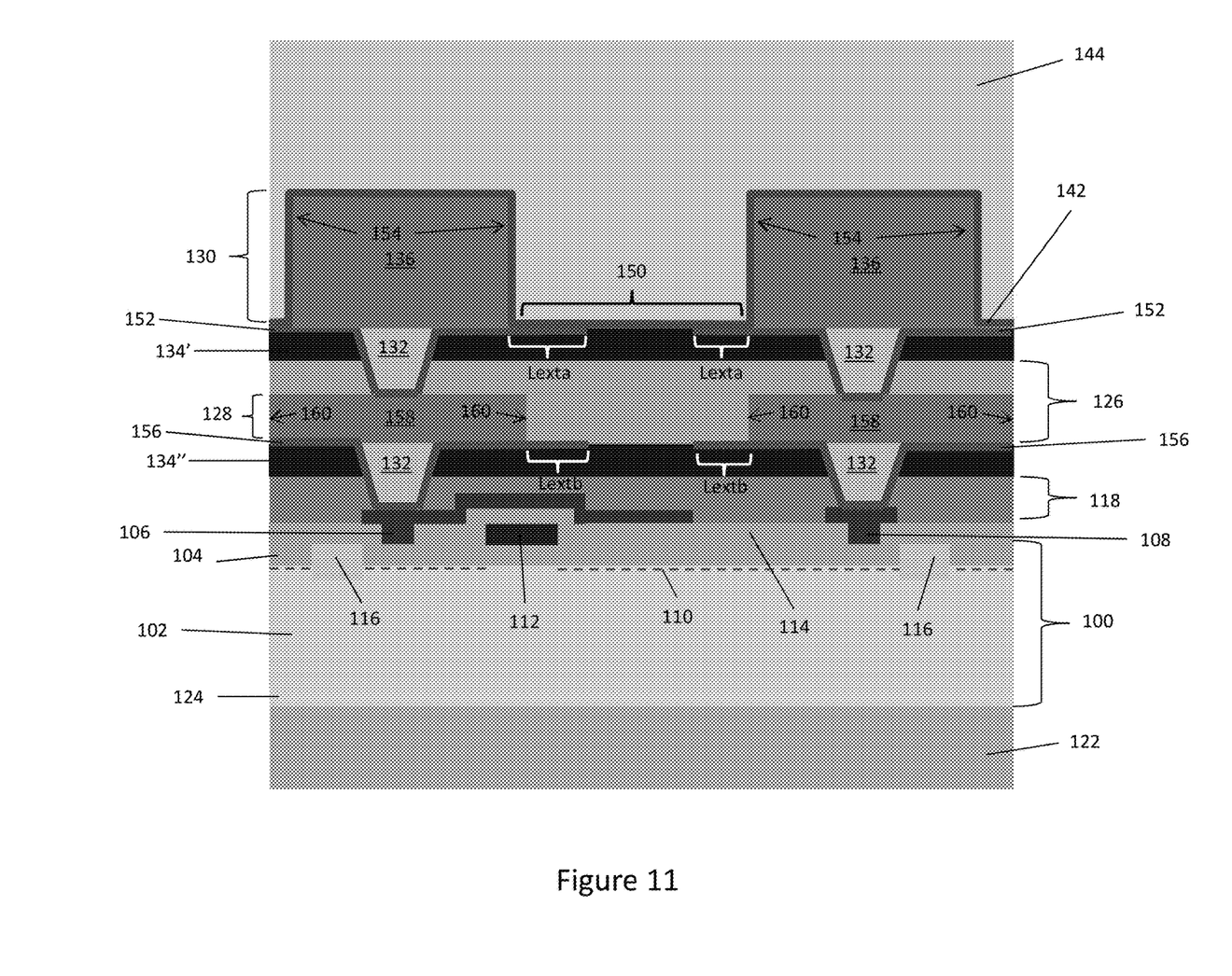

FIG. 11 illustrates another embodiment in which the electrically conductive liners 152 extend under the region 150 of the top passivation layer 142 positioned between adjacent metals lines 136 of the uppermost metal layer 130. The embodiment shown in FIG. 11 is similar to the embodiment shown in FIG. 10. In addition, an additional water/ion barrier 134" is disposed below the uppermost metal layer 130 and in or on a different interlayer dielectric 118 than the other barrier 134' as previously described herein. The additional barrier 134" is configured to prevent water, water ions, sodium ions and potassium ions from diffusing into the interlayer dielectric or portion of the interlayer dielectric 118 immediately below the additional barrier 134" over the required or specified device lifetime. Electrically conductive liners 156 are interposed between the metal lines 158 of the metal layer 128 immediately above the additional barrier 134" and the interlayer dielectric 118 immediately below that metal layer 128. Each of these lower electrically conductive liners 156 extends outward beyond opposing side faces 160 of the metal line 158 above that liner 156, to prevent cracks in the uppermost interlayer dielectric 126 from propagating to the underlying interlayer dielectric 118 and additional barrier 134". Deformation/movement in the lower metal layer 128 can occur if the metal lines 158 in this layer 128 are relatively thick (e.g. around 1000 nm) and made of a relatively soft metal such as Al, AlCu, AlSiCu and Au. Cracks in the uppermost interlayer dielectric 126 are most likely to occur in the region where the uppermost interlayer dielectric 126 contacts the metal lines 158 of the lower metal layer 128. The region of the uppermost interlayer dielectric 126 between the adjacent metals lines 158 does not tend to crack. The lateral extensions of the upper and lower liners 152, 156 for preventing crack propagation are labeled Lexta and Lextb, respectively, in FIG. 11.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
an III-V semiconductor body;
a device having a source, a drain and a two-dimensional charge carrier gas channel formed in the III-V semiconductor body;
one or more metal layers above the III-V semiconductor body;
an interlayer dielectric adjacent each metal layer;
a plurality of vias electrically connecting at least one of the one or more metal layers to the source and the drain of the device formed in the III-V semiconductor body;
a passivation layer touching and being supported by a top surface of the III-V semiconductor body, wherein the lowermost interlayer dielectric is touching and being supported by a top surface of the passivation layer, wherein the passivation layer is an ineffective barrier against diffusion of water, water ions, sodium ions and potassium ions into the III-V semiconductor body; and a barrier interposed between a first oxide layer and a second oxide layer of the lowermost interlayer dielectric, the barrier configured to prevent water, water ions, sodium ions and potassium ions from diffusing into the first oxide layer of the lowermost interlayer dielectric which is immediately below the barrier.

2. The semiconductor device of claim 1, wherein the barrier comprises silicon oxynitride.

3. The semiconductor device of claim 1, wherein the barrier comprises silicon nitride.

4. The semiconductor device of claim 1, wherein the passivation layer is a silicon nitride surface passivation layer that has a Si rich composition with a relatively low density of nitride as compared to silicon such that the silicon nitride surface passivation layer is ineffective barrier against the diffusion of water, water ions, sodium ions and potassium ions into the III-V semiconductor body.

5. The semiconductor device of claim 1, further comprising:

a field plate interposed between the passivation layer and the barrier.

6. The semiconductor device of claim 5, wherein a portion of the first oxide layer of the lowermost interlayer dielectric vertically separates the field plate from the barrier.

7. The semiconductor device of claim 5, wherein the field plate is electrically connected to the source of the device formed in the III-V semiconductor body and extends over a gate of the device.

8. The semiconductor device of claim 1, further comprising:

an additional passivation layer touching and being supported by a top surface of the uppermost metal layer; and an electrically conductive liner interposed between each metal line of the uppermost metal layer and the interlayer dielectric immediately below the uppermost metal layer, each electrically conductive liner extending outward beyond opposing side faces of the metal line above that electrically conductive liner.

9. The semiconductor device of claim 1, wherein the barrier comprises a plurality of layers of different materials interposed between the first oxide layer and the second oxide layer of the lowermost interlayer dielectric.

10. The semiconductor device of claim 1, further comprising:

an additional barrier disposed below the uppermost metal layer and in or on a different interlayer dielectric than the other barrier, the additional barrier configured to prevent water, water ions, sodium ions and potassium ions from diffusing into the interlayer dielectric or portion of the interlayer dielectric immediately below the additional barrier.

11. The semiconductor device of claim 10, wherein the barriers comprise different materials.

12. The semiconductor device of claim 1, wherein a single metal layer at most is embedded in the lowermost interlayer dielectric.

13. The semiconductor device of claim 1, wherein a single metal layer is embedded in the lowermost interlayer dielectric, and wherein the single metal layer is disposed below the barrier in the first oxide layer of the lowermost interlayer dielectric.

14. The semiconductor device of claim 1, wherein the lowermost interlayer dielectric is devoid of a metal layer.

15. The semiconductor device of claim 1, wherein the lowermost interlayer dielectric is devoid of a metal layer above the barrier.

16. The semiconductor device of claim 10, wherein a single metal layer at most is embedded in the interlayer dielectric in or on which the additional barrier is disposed.

17. The semiconductor device of claim 16, wherein the single metal layer comprises Al, AlCu, AlSiCu or Au.

18. The semiconductor device of claim 17, wherein the single metal layer further comprises an electrically conductive liner deposited in openings formed in the additional barrier.

19. The semiconductor device of claim 10, wherein a single metal layer is embedded in the interlayer dielectric in or on which the additional barrier is disposed, and wherein the single metal layer is disposed below the additional barrier.

20. The semiconductor device of claim 19, wherein the single metal layer comprises Al, AlCu, AlSiCu or Au.

21. The semiconductor device of claim 20, wherein the single metal layer further comprises an electrically conductive liner deposited in openings formed in the additional barrier.

22. The semiconductor device of claim 10, wherein the interlayer dielectric in or on which the additional barrier is disposed is devoid of a metal layer above the additional barrier.

* * * * *